US010418937B2

(12) United States Patent
Jeon et al.

(10) Patent No.: US 10,418,937 B2
(45) Date of Patent: Sep. 17, 2019

(54) RADIO FREQUENCY POWER AMPLIFIER WITH FEED-FORWARD SIGNAL PATH

(71) Applicant: Qorvo US, Inc., Greensboro, NC (US)

(72) Inventors: Hamhee Jeon, Long Beach, CA (US); Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/839,012

(22) Filed: Dec. 12, 2017

(65) Prior Publication Data

US 2018/0167032 A1 Jun. 14, 2018

Related U.S. Application Data

(60) Provisional application No. 62/432,978, filed on Dec. 12, 2016.

(51) Int. Cl.

| | | |
|---|---|---|
| *H03F 3/68* | (2006.01) | |
| *H03B 5/12* | (2006.01) | |
| *H03K 3/03* | (2006.01) | |
| *H03K 3/011* | (2006.01) | |
| *H03F 1/32* | (2006.01) | |
| *H03F 3/60* | (2006.01) | |

(52) U.S. Cl.
CPC ........... *H03B 5/1212* (2013.01); *H03B 5/124* (2013.01); *H03B 5/1228* (2013.01); *H03F 1/3223* (2013.01); *H03F 3/602* (2013.01); *H03K 3/011* (2013.01); *H03K 3/0322* (2013.01); *H03F 2200/451* (2013.01); *H03F 2201/3212* (2013.01)

(58) Field of Classification Search
CPC .... H03B 5/1212; H03B 5/124; H03B 5/1228; H03F 1/00; H03F 1/3223; H03F 3/602; H03K 3/011; H03K 3/0322
USPC ............................. 330/124 R, 295, 51, 149
See application file for complete search history.

(56) References Cited

U.S. PATENT DOCUMENTS 9,431,969 B2 * 8/2016 Jeon ........................ H03F 3/195

OTHER PUBLICATIONS

Almuhaisen, Abdullah, et. al. "Novel Wide Band High-Efficiency Active Harmonic Injection Power Amplifier Concept", International Microwave Symposium, May 23-28, 2010, Anaheim, California, IEEE, pp. 664-667.

(Continued)

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

An RF power amplifier includes a quadrature coupler, an in-phase amplifier, a quadrature amplifier, and a feed-forward signal path. The quadrature coupler includes an in-phase input node, a quadrature input node, an isolated node, and an RF signal output node. The in-phase amplifier includes an in-phase amplifier output node coupled to the in-phase input node. The quadrature amplifier includes a quadrature amplifier output node coupled to the quadrature input node. The feed-forward signal path is configured to couple and condition a signal from one of the in-phase amplifier and the quadrature amplifier in order to provide a feed-forward output signal that when provided at the feed-forward output node cancels one or more harmonic signals.

20 Claims, 11 Drawing Sheets

(56) References Cited

OTHER PUBLICATIONS

Bulja, Senad, et. al., "Combined Low Frequency and Third Harmonic Injection in Power Amplifier Linearization", Microwave and Wireless Components Letters, vol. 19, Issue 9, Sep. 2009, IEEE, pp. 584-586.
Dani, Asmita, et al., "PA Efficiency and Linearity Enhancement Using External Harmonic Injection," Transactions of Microwave Theory and Techniques, vol. 60, Issue 12, Dec. 2012, IEEE, pp. 4097-4106.
Jeon, Hamhee, et. al. "A Triple-Mode Balanced Linear CMOS Power Amplifier Using a Switched-Quadrature Coupler," Journal of Solid-State Circuits, vol. 47, Issue 9, Sep. 2012, IEEE, pp. 2019-2032.
Seidel, H., "A Microwave Feed-Forward Experiment," Bell System Technical Journal, vol. 50, Issue 9, Nov. 1971, pp. 2879-2916.

\* cited by examiner

RADIO FREQUENCY POWER AMPLIFIER WITH FEED-FORWARD SIGNAL PATH

RELATED APPLICATIONS

This application claims the benefit of provisional patent application Ser. No. 62/432,978, filed Dec. 12, 2016, the disclosure of which is hereby incorporated herein by reference in its entirety.

FIELD OF THE DISCLOSURE

The present disclosure relates to radio frequency (RF) power amplifiers, and in particular to quadrature power amplifiers including a feed-forward path to increase linearity and provide good efficiency.

BACKGROUND

Figure 1:
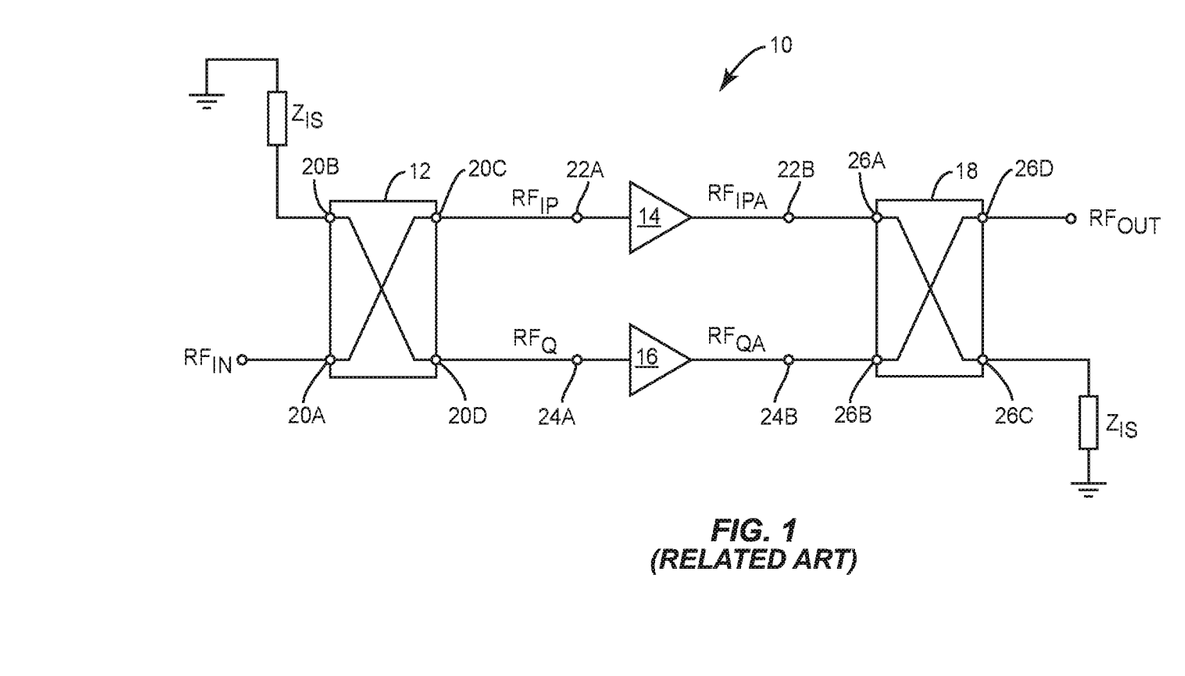
FIG. 1 is a functional schematic illustrating details of a conventional quadrature amplifier.

Radio frequency (RF) power amplifiers are used to amplify RF signals for transmission over the air. One common type of RF power amplifier is a quadrature power amplifier, also known as a balanced power amplifier. FIG. 1 illustrates a conventional quadrature power amplifier 10. The conventional quadrature power amplifier 10 includes a quadrature splitter 12, an in-phase amplifier 14, a quadrature amplifier 16, and a quadrature coupler 18. The quadrature splitter 12 includes an RF signal input node 20A, an isolated node 20B, an in-phase output node 20C, and a quadrature output node 20D. The RF signal input node 20A is configured to receive an RF input signal RF_IN for amplification thereof. The isolated node 20B is coupled to ground via an isolation impedance Z_IS. The in-phase output node 20C is coupled to an in-phase amplifier input node 22A of the in-phase amplifier 14. The quadrature output node 20D is coupled to a quadrature amplifier output node 24A of the quadrature amplifier 16. The quadrature coupler 18 includes an in-phase input node 26A, a quadrature input node 26B, an isolated node 26C, and an RF signal output node 26D. An in-phase amplifier output node 22B of the in-phase amplifier 14 is coupled to the in-phase input node 26A. A quadrature amplifier output node 24B of the quadrature amplifier 16 is coupled to the quadrature input node 26B. The isolated node 26C is coupled to ground via an isolation impedance Z_IS. The RF signal output node 26D provides an amplified RF output signal RF_OUT.

In operation, the RF input signal RF_IN is split into an in-phase signal RF_IP and a quadrature signal RF_Q by the quadrature splitter 12. Those skilled in the art will appreciate that the in-phase signal RF_IP is equal to the RF input signal RF_IN multiplied by $\sqrt{2}/2$ and the quadrature signal RF_Q is equal to the RF input signal RF_IN multiplied by $\sqrt{2}/2$ and shifted in phase by $-90°$. Due to the finite input impedance of the in-phase amplifier 14 and the quadrature amplifier 16, a portion of the RF input signal RF_IN is reflected back towards the quadrature splitter 12 by them both. Those skilled in the art will appreciate that due to the nature of the quadrature splitter 12, the reflected signals cancel one another at the RF signal input node 20A while summing at the isolated node 20B, where they are diverted via the isolation impedance Z_IS to ground. Accordingly, these reflected signals do not degrade the performance of the conventional quadrature power amplifier 10.

The in-phase signal RF_IP is amplified by the in-phase amplifier 14, while the quadrature signal RF_Q is amplified by the quadrature amplifier 16. The amplified in-phase signal RF_IPA and the amplified quadrature signal RF_QA are provided to the in-phase input node 26A and the quadrature input node 26B, respectively, where they are recombined at the RF signal output node 26D. Similar to the quadrature splitter 12, portions of the amplified in-phase signal RF_IPA and the amplifier quadrature signal RF_QA from the outputs of the in-phase amplifier 14 and the quadrature amplifier 16 are cancelled at the RF signal output node 26D and summed at the isolated node 26C, where they are diverted via the isolation impedance Z_IS to ground. Accordingly, these reflected signals do not degrade the performance of the conventional quadrature power amplifier 10.

As RF technologies continue to evolve, RF power amplifiers are subject to increasingly strict specifications. For example, fifth generation (5G) wireless standards provide both very stringent linearity and efficiency specifications. Standing alone, a conventional balanced amplifier such as the one discussed above cannot satisfy these stringent specifications. While feed-forward and feedback techniques have been implemented in the art in an effort to increase linearity, they generally degrade other aspects of performance such as efficiency or add significant complexity to a system, which may preclude the use of the system in a mobile device. Accordingly, there is a need for an improved RF power amplifier that provides both high linearity and high efficiency.

SUMMARY

The present disclosure relates to radio frequency (RF) power amplifiers, and in particular to quadrature power amplifiers including a feed-forward path to increase linearity and provide good efficiency. In one embodiment, an RF power amplifier includes a quadrature coupler, an in-phase amplifier, a quadrature amplifier, and a feed-forward signal path. The quadrature coupler includes an in-phase input node, a quadrature input node, an isolated node, and an RF signal output node. The in-phase amplifier includes an in-phase amplifier output node coupled to the in-phase input node. The quadrature amplifier includes a quadrature amplifier output node coupled to the quadrature input node. The feed-forward signal path includes a feed-forward input node configured to receive a feed-forward signal from one of the in-phase amplifier output node and the quadrature amplifier output node, a feed-forward output node coupled to the isolated node of the quadrature coupler, and feed-forward signal conditioning circuitry coupled between the feed-forward input node and the feed-forward output node and configured to condition a feed-forward input signal to provide a feed-forward output signal that, when provided at the feed-forward output node, cancels one or more harmonic signals at the in-phase input node and the quadrature input node. Using the feed-forward signal path results in increased linearity of the RF power amplifier with a minimal impact on the efficiency thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2A:
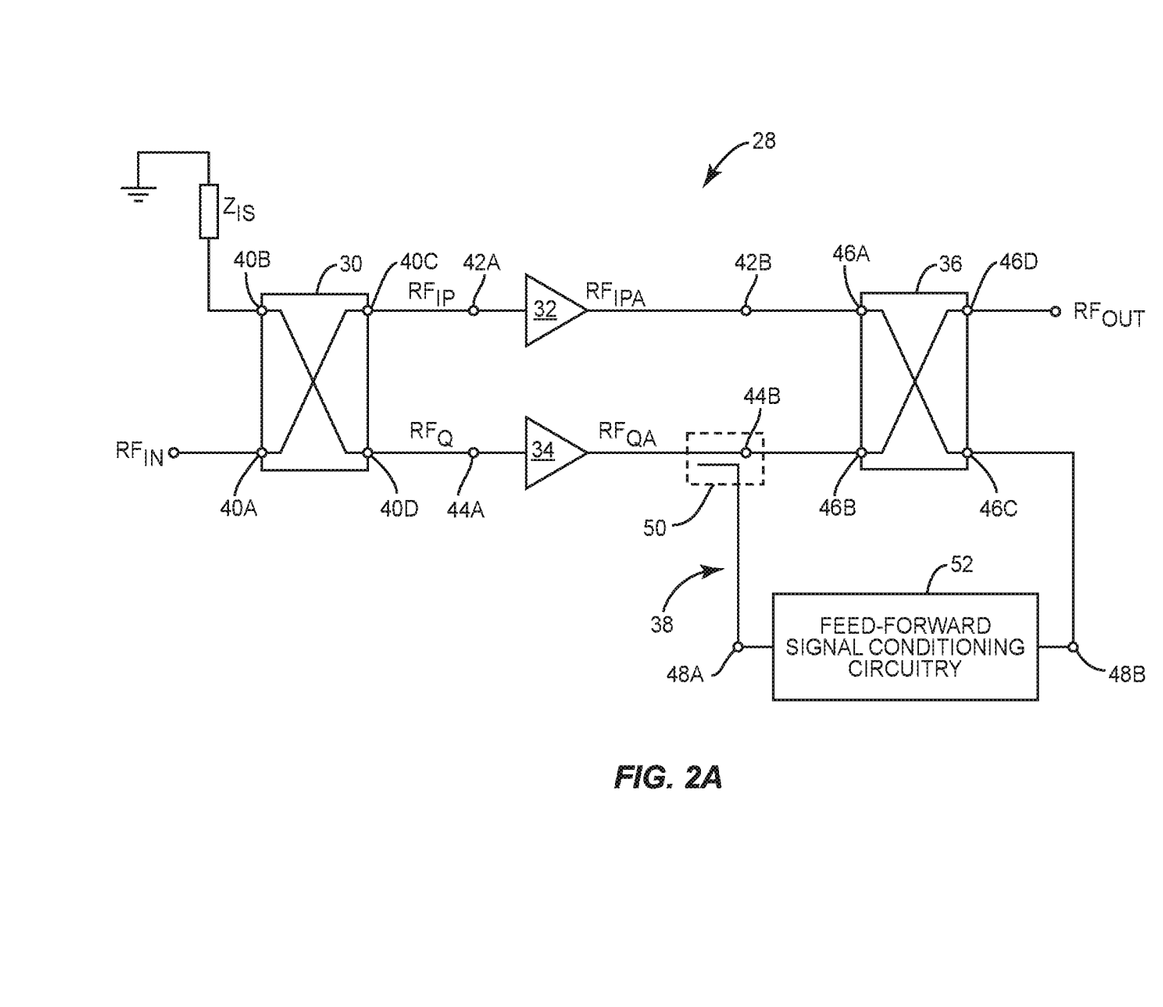
FIGS. 2A, 2B, 2C, and 2D are functional schematics illustrating details of a radio frequency (RF) power amplifier according to one embodiment of the present disclosure.

FIG. 2A shows an RF power amplifier 28 according to one embodiment of the present disclosure. The RF power amplifier 28 includes a quadrature splitter 30, an in-phase amplifier 32, a quadrature amplifier 34, a quadrature coupler 36, and a feed-forward signal path 38. The quadrature splitter 30 includes an RF signal input node 40A, an isolated node 40B, an in-phase output node 40C, and a quadrature output node 40D. The RF signal input node 40A is configured to receive an RF input signal RF_IN for amplification thereof. The isolated node 40B is coupled to a ground via an isolation impedance Z_IS. The in-phase output node 40C is coupled to an in-phase amplifier input node 42A of the in-phase amplifier 32. The quadrature output node 40D is coupled to a quadrature amplifier input node 44A of the quadrature amplifier 34. The quadrature coupler 36 includes an in-phase input node 46A, a quadrature input node 46B, an isolated node 46C, and an RF signal output node 46D. An in-phase amplifier output node 42B of the in-phase amplifier 32 is coupled to the in-phase input node 46A. A quadrature amplifier output node 44B of the quadrature amplifier 34 is coupled to the quadrature input node 46B. The isolated node 46C is coupled to the quadrature amplifier output node 44B via the feed-forward signal path 38. Specifically, a feed-forward input node 48A is coupled to the quadrature amplifier output node 44B and a feed-forward output node 48B is coupled to the isolated node 46C.

In operation, the RF input signal RF_IN is split into an in-phase signal RF_IP and a quadrature signal RF_Q by the quadrature splitter 30 as discussed above. The in-phase signal RF_IP is amplified by the in-phase amplifier 32, while the quadrature signal RF_Q is amplified by the quadrature amplifier 34. The amplified in-phase signal RF_IPA and the amplified quadrature signal RF_QA are provided to the in-phase input node 46A and the quadrature input node 46B, respectively, where they are recombined at the RF signal output node 46D. Further, a portion of the amplified quadrature signal RF_QA is coupled by a signal coupler 50 into the feed-forward signal path 38 as a feed-forward input signal FF_IN. Feed-forward signal conditioning circuitry 52 in the feed-forward signal path 38 conditions the feed-forward input signal FF_IN to provide a feed-forward output signal FF_OUT to the isolated node 46C, where it travels back through the quadrature coupler 36 to cancel a portion of one or more harmonic signals at the in-phase input node 46A and the quadrature input node 46B. Details of the feed-forward signal conditioning circuitry 52 and how it provides the feed-forward output signal FF_OUT to provide cancellation of harmonic signals are discussed in detail below.

Figure 2B:
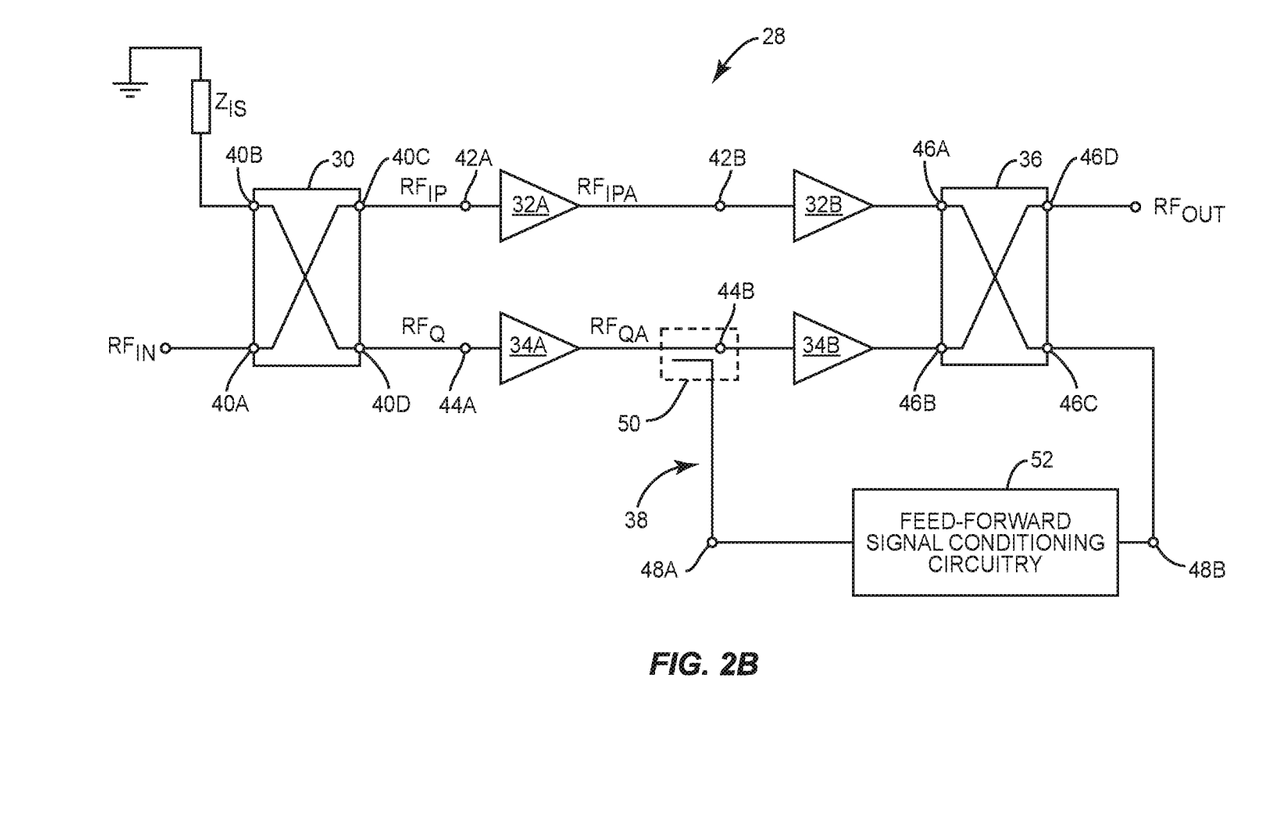

While only one in-phase amplifier 32 and one quadrature amplifier 34 are shown in FIG. 2A, those skilled in the art will appreciate that the in-phase amplifier 32 and the quadrature amplifier 34 may comprise multiple discreet amplifiers and/or amplifier stages without departing from the principles of the present disclosure. In some embodiments, the signal coupler 50 may be provided at the output of one of these intermediate amplifier stages, as illustrated in FIG. 2B. FIG. 2B is substantially the same as FIG. 2A, except that the in-phase amplifier 32 is provided as a first in-phase amplifier stage 32A and a final in-phase amplifier stage 32B and the quadrature amplifier 34 is provided as a first quadrature amplifier stage 34A and a final quadrature amplifier stage 34B. The signal coupler 50 is provided at an output of the first quadrature amplifier stage 34A in this embodiment. Accordingly, the feed-forward input signal FF_IN is the signal provided at the output of the first quadrature amplifier stage 34A.

Figure 2C:
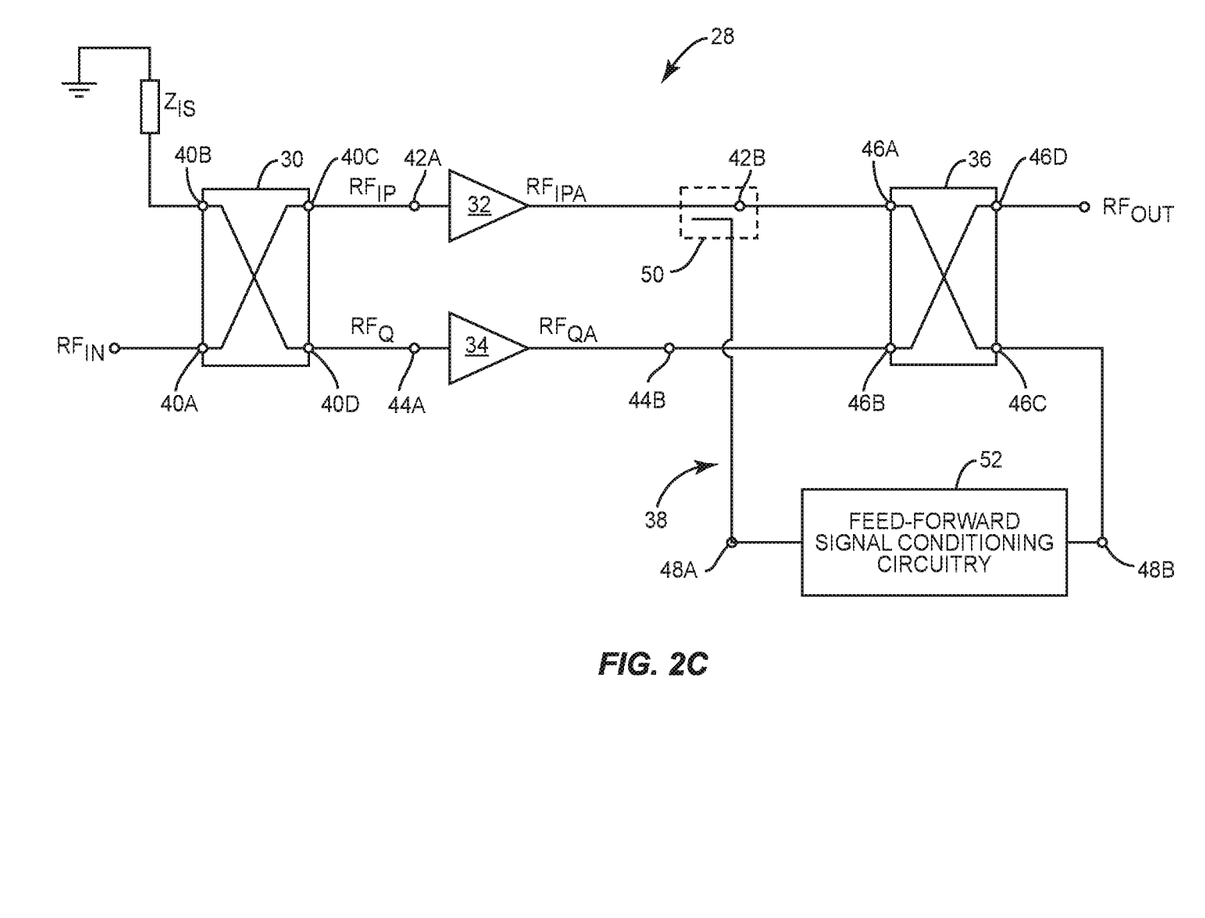
Figure 2D:
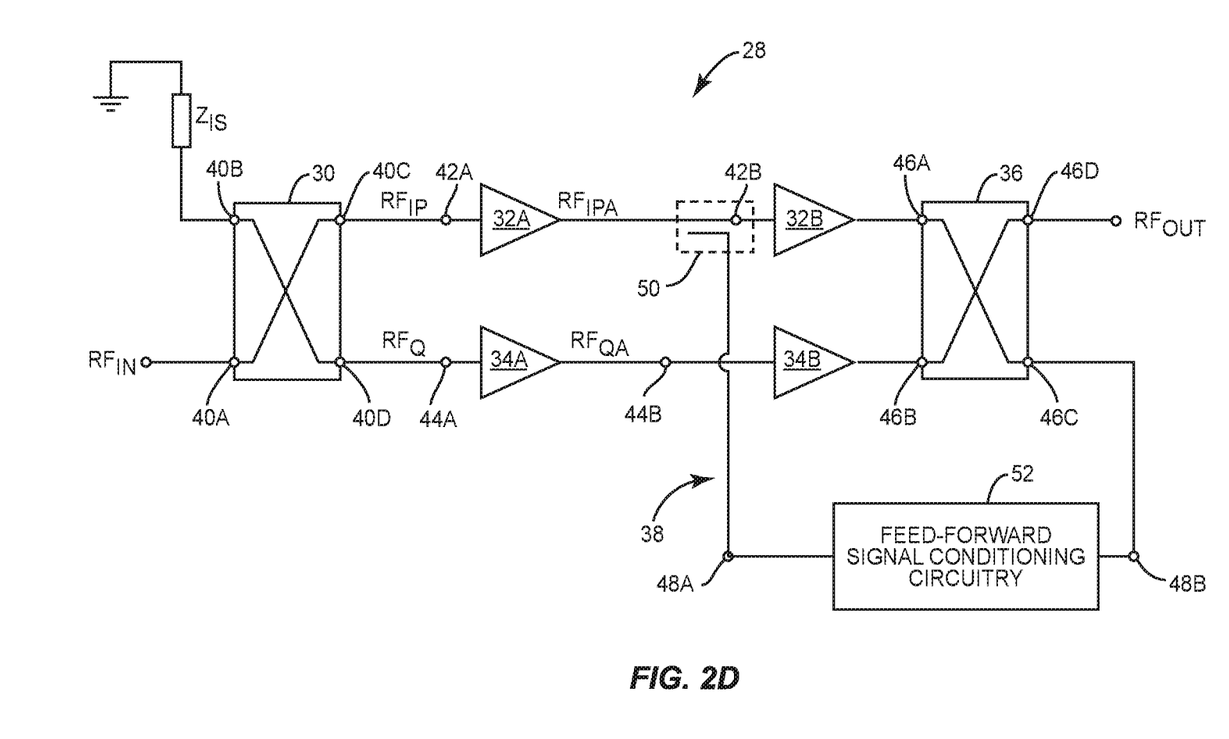

In some embodiments, the signal coupler 50 is provided at the output of the in-phase amplifier 32 as shown in FIG. 2C. Further, in embodiments including multiple amplifier stages for the in-phase amplifier 32 and the quadrature amplifier 34 as discussed above with respect to FIG. 2B, the signal coupler 50 may be provided at the output of an intermediate in-phase amplifier stage as shown in FIG. 2D.

Figure 3:
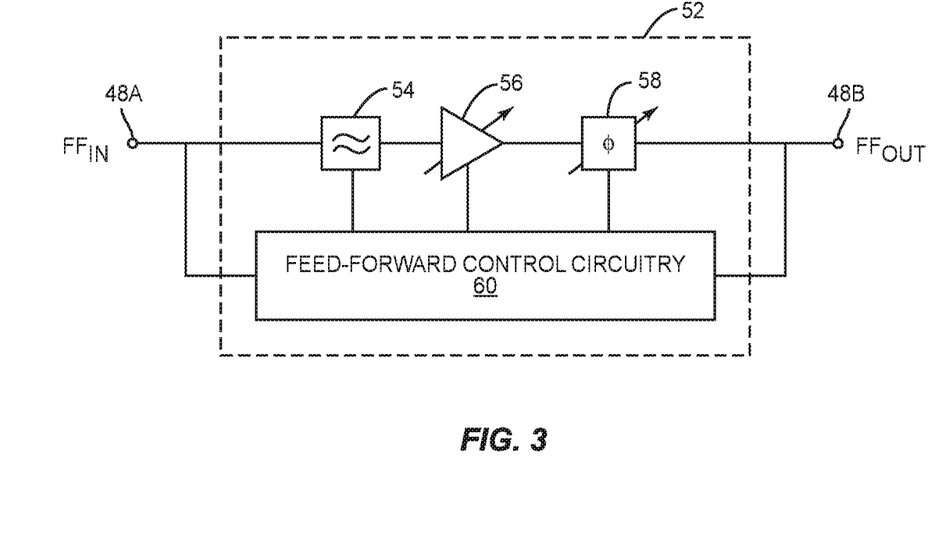
FIG. 3 is a functional schematic illustrating details of feed-forward signal conditioning circuitry according to one embodiment of the present disclosure.

FIG. 3 shows details of the feed-forward signal conditioning circuitry 52 according to one embodiment of the present disclosure. As shown, the feed-forward signal conditioning circuitry 52 may include a filter 54, a variable gain amplifier 56, and a phase shifter 58. Feed-forward control circuitry 60 may control a filter response of the filter 54, a gain of the variable gain amplifier 56, and/or a phase shift of the phase shifter 58 in order to condition the feed-forward input signal FF_IN and provide the feed-forward output signal FF_OUT such that it cancels one or more harmonic signals as discussed above. In some embodiments, the filter 54 is fixed rather than tunable. In those cases, the feed-forward control circuitry 60 does not control a filter response thereof. In some embodiments, the feed-forward control circuitry 60 may control the filter response of the filter 54, the gain of the variable gain amplifier 56, and/or the phase shift of the phase shifter 58 continuously based on a power of the feed-forward input signal FF_IN and/or the feed-forward output signal FF_OUT, a frequency of the feed-forward input signal FF_IN and/or the feed-forward output signal FF_OUT, and a temperature, for example, of one or more components in the RF power amplifier 28 and/or the RF power amplifier 28 as a whole. In other embodiments, the feed-forward control circuitry 60 may set the filter response of the filter 54, the gain of the variable gain amplifier 56, and/or the phase shift of the phase shifter 58 based on commands received via a serial communication bus or according to pre-configured control profiles for the RF power amplifier 28 that are pre-programmed.

The filter response of the filter 54 may capture any portion of the signal spectrum of the feed-forward input signal FF_IN in order to create the feed-forward output signal FF_OUT to cancel one or more harmonic signals. In some embodiments, the filter response of the filter 54 is tuned to a specific harmonic of the feed-forward input signal FF_IN (and thus the output signal of one of the amplifiers at which the signal coupler 50 is provided). The gain provided by the variable gain amplifier 56 and/or the phase shift of the phase shifter 58 may also be adjusted to any number of values in order to provide the desired cancellation as discussed above.

Figure 4:
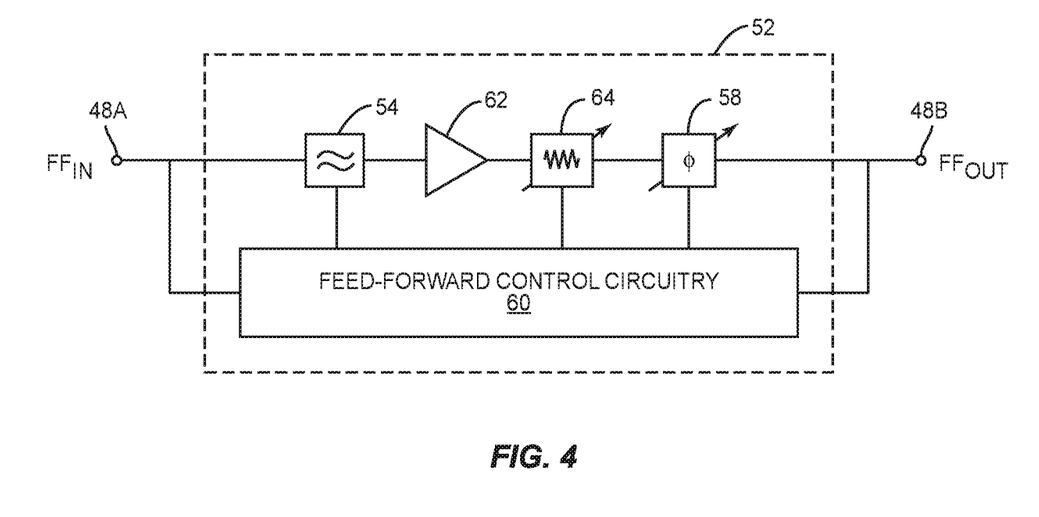
FIG. 4 is a functional schematic illustrating details of feed-forward signal conditioning circuitry according to one embodiment of the present disclosure.

FIG. 4 shows details of the feed-forward signal conditioning circuitry 52 according to an additional embodiment of the present disclosure. The feed-forward signal conditioning circuitry 52 shown in FIG. 4 is substantially similar to that shown in FIG. 3, except that the variable gain amplifier 56 is replaced with a fixed gain amplifier 62 and an attenuator 64. Once again, the feed-forward control circuitry 60 may control a filter response of the filter 54, an amount of attenuation of the attenuator 64, and/or a phase shift of the phase shifter 58 in order to condition the feed-forward input signal FF_IN and provide the feed-forward output signal FF_OUT such that it cancels one or more harmonic signals as discussed above. In some embodiments, the filter 54 is fixed rather than tunable. In those cases, the feed-forward control circuitry 60 does not control a filter response thereof.

Similar to the above, the filter response of the filter 54 may capture any portion of the signal spectrum of the feed-forward input signal FF_IN in order to create the feed-forward output signal FF_OUT to cancel one or more harmonic signals. In some embodiments, the filter response of the filter 54 is tuned to a specific harmonic of the feed-forward input signal FF_IN (and thus the output signal of one of the amplifiers at which the signal coupler 50 is provided). The attenuation provided by the attenuator 64 and/or the phase shift of the phase shifter 58 may also be adjusted to any number of values in order to provide the desired cancellation as discussed above.

Figure 5:
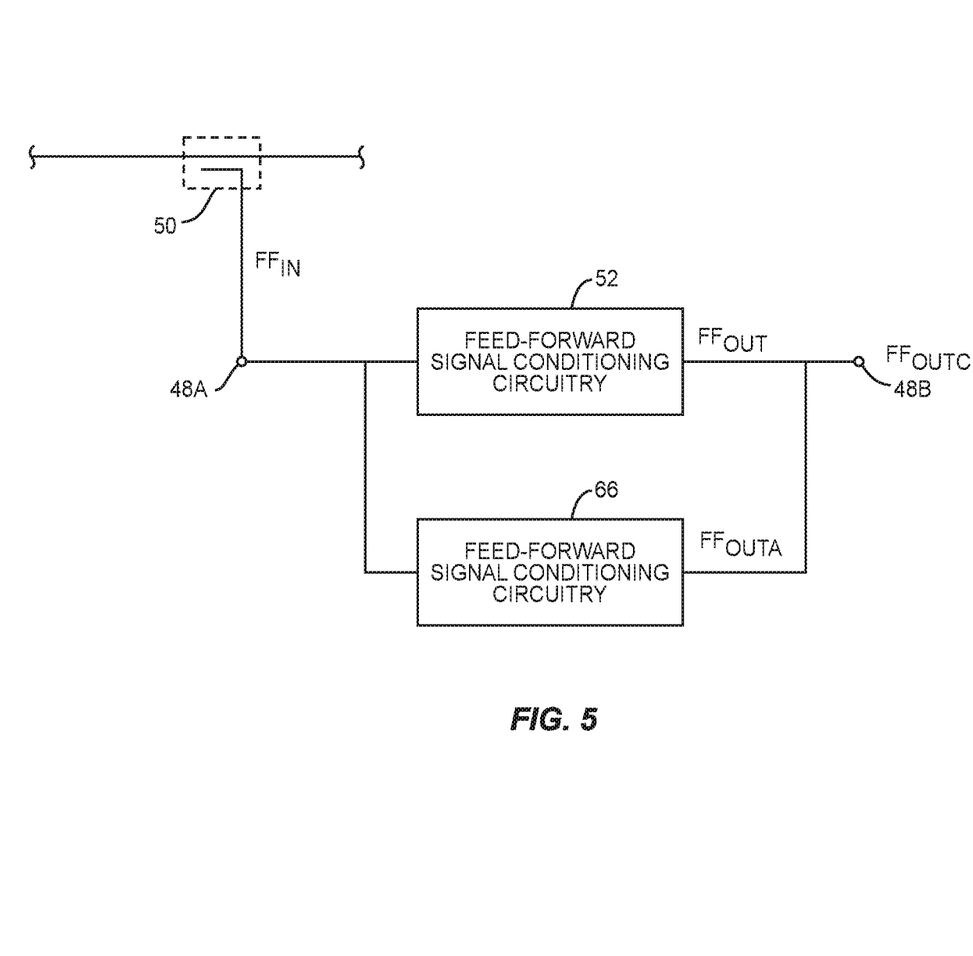
FIG. 5 is a functional schematic illustrating details of a feed-forward signal path according to one embodiment of the present disclosure.

FIG. 5 shows the feed-forward signal path 38 according to one embodiment of the present disclosure. In this embodiment, the feed-forward signal path 38 includes the feed-forward signal conditioning circuitry 52 and additional feed-forward signal conditioning circuitry 66. The feed-forward signal conditioning circuitry 52 may operate as described above to condition a feed-forward input signal FF_IN coupled by the signal coupler 50 to provide a feed-forward output signal FF_OUT that cancels one or more harmonic signals when fed back through the isolated node 46C of the quadrature coupler 36 of the RF power amplifier 28. Similarly, the additional feed-forward signal conditioning circuitry 66 may condition the feed-forward input signal FF_IN to provide an additional feed-forward output signal FF_OUTA that also cancels one or more harmonic signals when fed back through the isolated node 46C of the quadrature coupler 36 of the RF power amplifier 28. However, the one or more harmonic signals cancelled by the feed-forward output signal FF_OUT may be different from the one or more harmonic signals cancelled by the additional feed-forward output signal FF_OUTA. For example, the feed-forward output signal FF_OUT provided by the feed-forward signal conditioning circuitry 52 may cancel harmonic signals at a third harmonic, while the additional feed-forward output signal FF_OUT provided by the additional feed-forward signal conditioning circuitry 66 may cancel harmonic signals at a fourth harmonic. While only two feed-forward signal conditioning circuitries are shown in FIG. 5, those skilled in the art will appreciate that any number of different feed-forward signal conditioning circuitries may be provided in the feed-forward signal path 38, each of which is targeted to cancel harmonic signals at a specific harmonic or a group of harmonics. The feed-forward output signal FF_OUT and the additional feed-forward output signal FF_OUTA are combined at an output of the feed-forward signal path 38 as a combined feed-forward output signal FF_OUTC, where they may cancel one or more harmonic signals within several different harmonics.

Details of the additional feed-forward signal conditioning circuitry 66 may be the same as those of the feed-forward signal conditioning circuitry 52 discussed above with respect to FIG. 3 and FIG. 4 and thus are not separately shown. In some embodiments, the additional feed-forward signal conditioning circuitry 66 includes separate feed-forward control circuitry from the feed-forward signal conditioning circuitry 52. In other embodiments, the feed-forward signal conditioning circuitry 52 and the additional feed-forward signal conditioning circuitry 66 use the same feed-forward control circuitry.

Figure 6A:
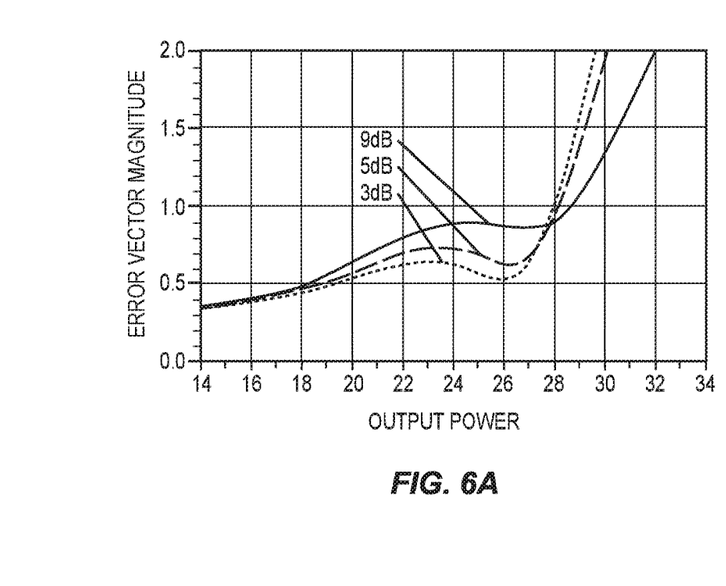
FIGS. 6A and 6B are graphs illustrating the performance of an RF power amplifier according to one embodiment of the present disclosure.
Figure 6B:
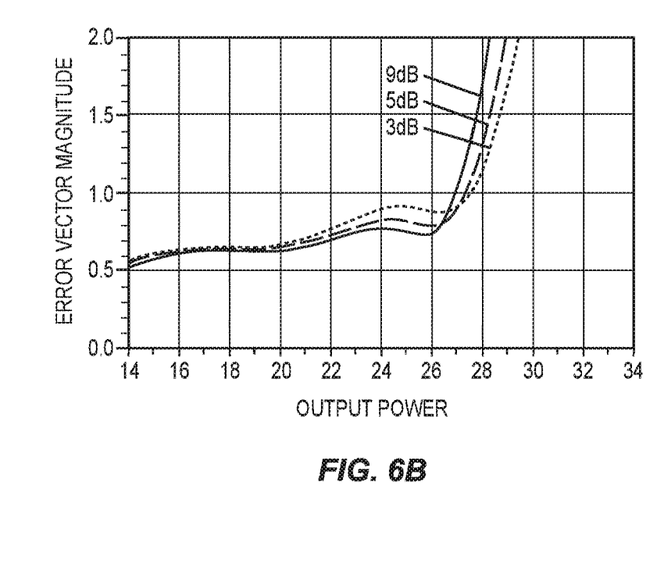

FIGS. 6A and 6B are graphs illustrating error vector magnitude versus output power for the RF power amplifier 28 when different values of gain are used in the feed-forward signal path 38. Specifically, FIG. 6A illustrates the relationship between error vector magnitude and output power for transmission of low band WiFi signals from the RF power amplifier 28, which may be as low as 2.4 GHz and up to mid-band frequencies of 5.5 GHz, while FIG. 6B illustrates the relationship between error vector magnitude and output power for transmission of high band WiFi signals from the RF power amplifier, which may be between 5.5 GHz and 6 GHz. Said gain may be provided at 3 dB, 5 dB, and 9 dB in this example, and may be provided by either the variable gain amplifier 56 discussed above, the combination of the fixed gain amplifier 62 and the attenuator 64, or any other components in the feed-forward signal conditioning circuitry 52. As shown in FIG. 6A, increasing the signal gain within the feed-forward signal path 38 results in higher error vector magnitude at lower output power, but decreases the slope at which error vector magnitude increases at higher output power. The decrease in the slope at which the error vector magnitude increases may be critical in advanced wireless operation modes (e.g., 5G, WiFi, and the like). FIG. 6B shows an opposite effect, wherein increasing the signal gain within the feed-forward signal path 38 results in lower error vector magnitude at lower output power and increases the slope at which the error vector magnitude increases at higher output power. The feed-forward control circuitry 60 may take this into account and thus change the signal gain of the feed-forward signal path 38 in different operating modes of the RF power amplifier 28.

Figure 7A:
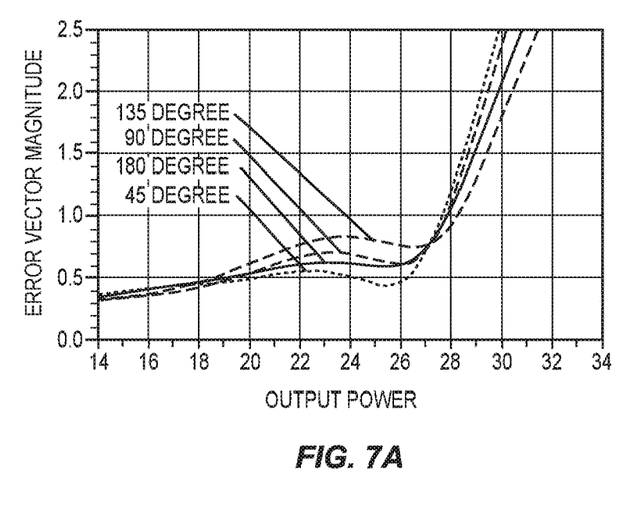
FIGS. 7A and 7B are graphs illustrating the performance of an RF power amplifier according to one embodiment of the present disclosure.
Figure 7B:
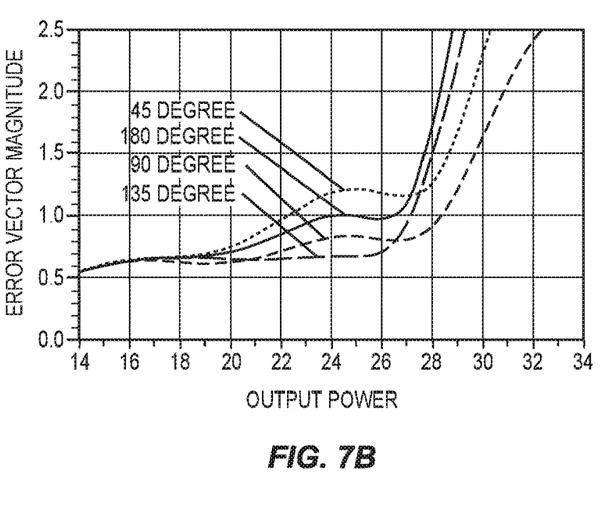

FIGS. 7A and 7B are graphs illustrating error vector magnitude versus output power for the RF power amplifier 28 when different phase shifts are used in the feed-forward signal path 38. Specifically, FIG. 7A illustrates the relationship between error vector magnitude and output power for transmission of low band WiFi signals from the RF power amplifier 28, while FIG. 7B illustrates the relationship between error vector magnitude and output power for transmission of high band WiFi signals from the RF power amplifier 28. As shown in FIGS. 7A and 7B, different phase shift values within the feed-forward signal path result in different trade-offs between error vector magnitude at lower output power and error vector magnitude at higher power. These trade-offs may change when the RF power amplifier 28 is operating at lower frequencies versus higher frequencies. Accordingly, the feed-forward control circuitry 60 may select the phase shift based on the desired error vector magnitude at a particular output power for the mode of operation of the RF power amplifier 28. The phase shift may be provided by the phase shifter 58 discussed above or by any other component.

Figure 8A:
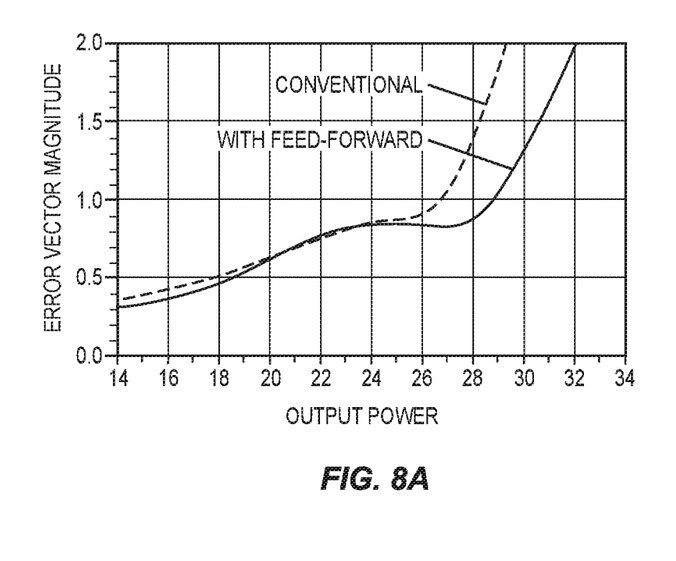
FIGS. 8A and 8B are graphs illustrating the performance of an RF power amplifier according to one embodiment of the present disclosure.
Figure 8B:
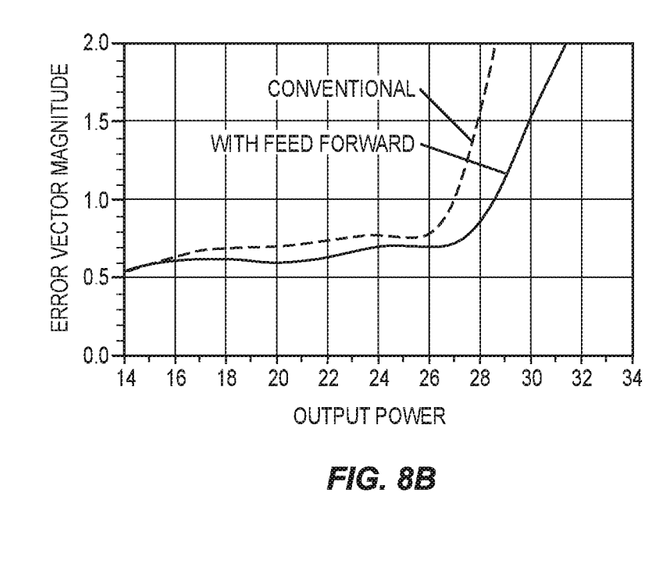

FIGS. 8A and 8B are graphs illustrating error vector magnitude versus output power for the RF power amplifier 28 and a conventional RF power amplifier not including the feed-forward signal path 38. Specifically, FIG. 8A illustrates the relationship between error vector magnitude and output power for transmission of low band WiFi signals for both the RF power amplifier 28 and a conventional RF power amplifier, while FIG. 8B illustrates the relationship between error vector magnitude and output power for transmission of high band WiFi signals for both the RF power amplifier 28 and a conventional RF power amplifier. As illustrated in both FIGS. 8A and 8B, the RF power amplifier 28 provides significantly lower error vector magnitude when compared to a conventional RF power amplifier not including the feed-forward signal path 38, especially at higher output powers where error vector magnitude may be critical. The RF power amplifier 28 does so with a favorable impact on efficiency, adding roughly 2% Pdc power from the ancillary feed-forward conditioning circuitry but increasing 1% and 1.8% and error vector magnitude linear power by between 1.5 dB and 2.0 dB and 2.0 dB and 3.5 dB, respectively, when compared to a conventional RF power amplifier.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) power amplifier comprising:
a quadrature coupler comprising an in-phase input node, a quadrature input node, an isolated node, and an RF signal output node;
an in-phase amplifier comprising an in-phase amplifier output node coupled to the in-phase input node of the quadrature coupler;
a quadrature amplifier comprising a quadrature amplifier output node coupled to the quadrature input node of the quadrature coupler; and
a feed-forward signal path comprising:
a feed-forward input node configured to receive a feed-forward input signal through a signal coupler coupled to one of the in-phase amplifier output node or the quadrature amplifier output node;
a feed-forward output node coupled to the isolated node of the quadrature coupler; and
feed-forward signal conditioning circuitry coupled between the feed-forward input node and the feed-forward output node and configured to condition the feed-forward input signal such that a feed-forward output signal provided at the feed-forward output node provides cancellation of one or more harmonic signals at the in-phase input node and the quadrature input node of the quadrature coupler.

2. The RF power amplifier of claim 1 wherein the feed-forward input node is configured to receive the feed-forward input signal from the quadrature amplifier output node.

3. The RF power amplifier of claim 1 further comprising an additional feed-forward signal path comprising:

an additional feed-forward input node coupled to one of the in-phase amplifier output node and the quadrature amplifier output node;

an additional feed-forward output node coupled to the isolated node of the quadrature coupler; and additional feed-forward signal conditioning circuitry coupled between the additional feed-forward input node and the additional feed-forward output node and configured to condition the feed-forward input signal provided at the feed-forward input node such that an additional feed-forward output signal provided at the feed-forward output node provides cancellation of one or more harmonic signals at the in-phase input node and the quadrature input node of the quadrature coupler, wherein the one or more harmonic signals cancelled by the feed-forward output signal are different than the one or more harmonic signals cancelled by the additional feed-forward output signal.

4. The RF power amplifier of claim 3 wherein the feed-forward signal conditioning circuitry and the additional feed-forward signal conditioning circuitry each comprise:
   a filter configured to isolate a portion of a signal spectrum of the feed-forward input signal;
   a variable gain amplifier configured to amplify the feed-forward input signal; and
   a phase shifter configured to change a phase of the feed-forward input signal.

5. The RF power amplifier of claim 4 wherein the feed-forward signal conditioning circuitry and the additional feed-forward signal conditioning circuitry each further comprise feed-forward control circuitry configured to operate the filter, the variable gain amplifier, and the phase shifter such that the feed-forward output signal and the additional feed-forward output signal cancel the one or more harmonic signals.

6. The RF power amplifier of claim 4 wherein the filter of the feed-forward signal conditioning circuitry provides a filter response that is different from a filter response of the filter of the additional feed-forward signal conditioning circuitry.

7. The RF power amplifier of claim 3 wherein the feed-forward signal conditioning circuitry and the additional feed-forward signal conditioning circuitry comprise:
   a filter configured to isolate a portion of a signal spectrum of the feed-forward input signal;
   a fixed gain amplifier configured to amplify the feed-forward input signal;
   an attenuator configured to reduce an amplitude of the feed-forward input signal; and
   a phase shifter configured to change a phase of the feed-forward input signal.

8. The RF power amplifier of claim 7 wherein the feed-forward signal conditioning circuitry and the additional feed-forward signal conditioning circuitry each further comprise feed-forward control circuitry configured to operate the filter, the attenuator, and the phase shifter such that the feed-forward output signal and the additional feed-forward output signal cancel the one or more harmonic signals.

9. The RF power amplifier of claim 3 wherein the in-phase amplifier and the quadrature amplifier are not identical.

10. The RF power amplifier of claim 3 wherein the feed-forward signal conditioning circuitry and the additional feed-forward signal conditioning circuitry are configured to condition the feed-forward input signal continuously based on one or more of a power of the feed-forward input signal, a frequency of the feed-forward input signal, and a temperature.

11. The RF power amplifier of claim 1 wherein the feed-forward signal conditioning circuitry comprises:
    a filter configured to isolate a portion of a signal spectrum of the feed-forward input signal;
    a variable gain amplifier configured to amplify the feed-forward input signal; and
    a phase shifter configured to change a phase of the feed-forward input signal.

12. The RF power amplifier of claim 11 wherein the feed-forward signal conditioning circuitry further comprises feed-forward control circuitry configured to operate the filter, the variable gain amplifier, and the phase shifter such that the feed-forward output signal cancels the one or more harmonic signals.

13. The RF power amplifier of claim 1 wherein the feed-forward signal conditioning circuitry comprises:
    a filter configured to isolate a portion of a signal spectrum of the feed-forward input signal;
    a fixed gain amplifier configured to amplify the feed-forward input signal;
    an attenuator configured to reduce an amplitude of the feed-forward input signal; and
    a phase shifter configured to change a phase of the feed-forward input signal.

14. The RF power amplifier of claim 13 wherein the feed-forward signal conditioning circuitry further comprises feed-forward control circuitry configured to operate the filter, the attenuator, and the phase shifter such that the feed-forward output signal cancels the one or more harmonic signals.

15. The RF power amplifier of claim 1 wherein at least one of the in-phase amplifier and the quadrature amplifier comprises multiple amplifier stages.

16. The RF power amplifier of claim 1 wherein the feed-forward signal conditioning circuitry is configured to condition the feed-forward input signal continuously based on one or more of a power of the feed-forward input signal, a frequency of the feed-forward input signal, and a temperature.

17. The RF power amplifier of claim 1 further comprising a plurality of additional feed-forward signal paths, each comprising:
    an additional feed-forward input node coupled to one of the in-phase amplifier output node and the quadrature amplifier output node;
    an additional feed-forward output node coupled to the isolated node of the quadrature coupler; and
    additional feed-forward signal conditioning circuitry coupled between the additional feed-forward input node and the additional feed-forward output node and configured to condition the feed-forward input signal provided at the feed-forward input node such that an additional feed-forward output signal provided at the feed-forward output node provides cancellation of one or more harmonic signals at the in-phase input node and the quadrature input node of the quadrature coupler, wherein the one or more harmonic signals cancelled by the feed-forward output signal and the one or more harmonic signals cancelled by the additional feed-forward output signal from each one of the plurality of additional feed-forward signal paths are different from one another.

18. The RF power amplifier of claim 1 further comprising a quadrature splitter comprising:
    an RF signal input node;
    an isolated node coupled to ground via an isolation impedance;

an in-phase output node coupled to an in-phase amplifier input node of the in-phase amplifier; and a quadrature output node coupled to a quadrature amplifier input node of the quadrature amplifier.

19. The RF power amplifier of claim 18 wherein the feed-forward signal path further comprises a signal coupler configured to couple the feed-forward input signal from one of the in-phase amplifier output node and the quadrature amplifier output node.

20. A radio frequency (RF) power amplifier comprising:
- a quadrature coupler comprising an in-phase input node, a quadrature input node, an isolated node, and an RF signal output node;
- an in-phase amplifier comprising an in-phase amplifier output node coupled to the in-phase input node of the quadrature coupler;
- a quadrature amplifier comprising a quadrature amplifier output node coupled to the quadrature input node of the quadrature coupler; and
- a feed-forward signal path comprising:
  - a feed-forward input node configured to receive a feed-forward input signal;
  - a feed-forward output node coupled to the isolated node of the quadrature coupler; and
  - feed-forward signal conditioning circuitry coupled between the feed-forward input node and the feed-forward output node and comprising a filter configured to isolate a portion of a signal spectrum of the feed-forward input signal.

* * * * *